United States Patent
Saito

(10) Patent No.: US 7,595,662 B2
(45) Date of Patent: Sep. 29, 2009

(54) TRANSMISSION/RECEPTION APPARATUS FOR DIFFERENTIAL SIGNALS

(75) Inventor: Shinichi Saito, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/879,933

(22) Filed: Jul. 19, 2007

(65) Prior Publication Data
US 2008/0048713 A1    Feb. 28, 2008

(30) Foreign Application Priority Data

Jul. 19, 2006   (JP) ............................. 2006-197456
Jul. 19, 2006   (JP) ............................. 2006-197461

(51) Int. Cl.
*H03K 19/0175*   (2006.01)
*H03K 19/20*    (2006.01)
*H03K 19/094*   (2006.01)

(52) U.S. Cl. ..................... 326/82; 326/115; 327/108

(58) Field of Classification Search ............... 326/62, 326/68, 80, 93–98, 112, 115, 119, 121, 126, 326/127; 327/108, 109, 333; 379/400–404
See application file for complete search history.

(56) References Cited

U.S. PATENT DOCUMENTS 6,522,174 B2 * 2/2003 Martin et al. ............... 326/115
2007/0252618 A1 * 11/2007 Gopalakrishnan et al. ..... 326/87
2008/0061846 A1 *  3/2008 Kase et al. .................. 327/108

FOREIGN PATENT DOCUMENTS

| JP | 2005-64589 | 3/2005 |
|----|------------|--------|
| JP | 2005-64590 | 3/2005 |

* cited by examiner

*Primary Examiner*—Vibol Tan
*Assistant Examiner*—Dylan White
(74) *Attorney, Agent, or Firm*—Cantor Colburn LLP

(57) ABSTRACT

A transmission device transmits differential signals that are to be output, in the form of current signals via first and second output terminals. A first switching transistor and a first output transistor are serially connected between the grounded terminal, which is set to a fixed electric potential, and the first output terminal. A second switching transistor and a second output transistor are serially connected between the grounded terminal and the second output terminal. First and second bias transistors are provided in parallel with the first and second switching transistors, and generate a predetermined bias current. A pair of differential signals, which are to be transmitted, are input to the gates of the first and second switching transistors. The gates of the first and second output transistors are biased at a predetermined first voltage.

7 Claims, 3 Drawing Sheets

200a

TRANSMISSION/RECEPTION APPARATUS FOR DIFFERENTIAL SIGNALS

BACKGROUND OF THE INVENTION

1. Field of the Invention

The present invention relates to a transmission device and a transmission/reception apparatus using the transmission device. In particular, the present invention relates to a signal transmission technique using a current as the signal transmission medium.

2. Description of the Related Art

In general, electronic equipment comprises multiple circuits such as a central processing unit, a semiconductor integrated circuit, etc. For example, a cellular phone comprises a communication circuit, a display, an image capturing device, and so on. In such electronic equipment, each circuit executes the processing that corresponds to its function. For example, a communication circuit executes communication processing. A display displays given information. An image capturing circuit executes image capturing processing. Furthermore, such a circuit executes signal transmission processing with respect to another circuit. For example, the image capturing device transmits image data thus captured to a communication circuit. With conventional techniques, voltage is employed as the signal transmission medium between such circuits, and the voltage changes in a range between the power supply voltage and the ground. In recent years, the operation speed of each circuit has been becoming faster. Furthermore, the number of signals to be processed by the central processing device has been becoming larger. This leads to a demand for high speed transmission processing between the circuits. However, voltage signal transmission techniques have the following problem.

In general, differential signal lines between the circuits have capacitance. With such an arrangement, the charging/discharging of the capacitance according to the change in voltage occurs. In this case, the charge amount corresponds to the capacitance. Such an arrangement in which signals are transmitted via voltage requires an additional period of time for storing and releasing the charge that corresponds to the capacitance. This leads to an increased rising period of time and an increased falling period of time, resulting in a problem of difficulty in transmitting signals at a high speed. In order to solve this problem, a signal transmission technique has been proposed, which transmits signals via current instead of voltage (see Patent documents 1 and 2, for example).

[Patent Document 1]
Japanese Patent Application Laid-open No. 2005-64589

[Patent Document 2]
Japanese Patent Application Laid-open No. 2005-64590

DISCLOSURE OF THE INVENTION

Problems to be Solved by the Invention

With such an arrangement in which signals are transmitted via current, there is no need to generate a significant electric potential difference, unlike an arrangement in which signals are transmitted via voltage. This reduces the amount of charge to be stored in and released from the capacitance, thereby enabling signals to be transmitted at an increased speed. However, it is preferable to further reduce the change in the voltage generated in the current signal transmission.

Furthermore, let us consider a cellular phone, and, in particular, a foldable cellular phone having a structure in which a housing is partitioned into a part including a display and an image capturing device and a part including a communication circuit, and which allows the user to fold these parts. With such an arrangement, the layout is designed such that the differential signal lines run across a movable mechanism. The resolution of the image capturing device has been becoming higher, leading to an increased amount of data to be transmitted. Accordingly, the number of differential signal lines has been becoming larger. On the other hand, there is a demand for a technique for reducing the number of wiring lines in such an arrangement having a movable mechanism which allows the user to fold or rotate the housing, giving consideration to the degree of freedom of the layout of the differential signal lines provided across the movable mechanism. Furthermore, in general, such a reduced number of differential signal lines improves the reliability of the complex operation of the movable mechanism. In order to reduce the number of differential signal lines, the signal transmission speed must be increased for each differential signal line.

SUMMARY OF THE INVENTION

The inventor has made the present invention in view of such a situation. Accordingly, it is a general purpose of an embodiment of the present invention to provide a transmitting device having a mechanism in which there is a small change in the voltage signals passing through differential signal lines, thereby providing high-speed data transmission, and a transmission/reception apparatus using such a transmitting device.

Means for Solving the Problems

An embodiment of the present invention provides a transmission device, which transmits differential signals that are to be transmitted, in the form of current signals via a first output terminal and a second output terminal. The transmission device comprises: a first switching transistor and a first output transistor which are serially connected between a fixed-voltage terminal that is set to a fixed voltage and the first output terminal; a second switching transistor and a second output transistor which are serially connected between the fixed-voltage terminal and the second output terminal; and a first bias transistor and a second bias transistor which are provided in parallel with the first switching transistor and the second switching transistor, respectively, and each of which generates a predetermined bias current. With such an arrangement, a pair of the differential signals to be transmitted are input to the control terminals of the first switching transistor and the second switching transistor. Furthermore, the control terminals of the first output transistor and the second output transistor are biased at a predetermined first voltage.

With such an arrangement, at least a predetermined bias current flows through each of the first and second output transistors regardless of the state of the differential signals. This ensures that each of these transistors does not operate in a leak state. Such an arrangement increases the switching speed, thereby improving the data transmission speed. Furthermore, the first and second output transistors are biased by applying a predetermined bias current, thereby reducing the voltage amplitude at a node between the first output transistor and the first switching transistor and the voltage amplitude at a node between the second output transistor and the second switching transistor. Thus, such an arrangement improves the switching speed.

With such an embodiment, the transmission device may further comprise a first bias circuit which biases the control terminals of the first output transistor and the second output transistor at the predetermined first voltage. With such an arrangement, the first bias circuit may comprise: a first transistor, the control terminal of which is connected to the control terminals of the first output transistor and the second output transistor such that they share a common control terminal; and a second transistor which is provided on a path for the first transistor, and one terminal of which is connected to the fixed-voltage terminal. Also, a predetermined first bias current may be supplied to a path including the first transistor and the second transistor.

With such an arrangement, a pair comprising the first output transistor and the first bias transistor, a pair comprising the second output transistor and the second bias transistor, and a pair comprising the first transistor and the second transistor, are formed in the same configuration.

With such an embodiment, the transmission device may further comprise a second bias circuit which biases the control terminals of the first bias transistor and the second bias transistor at a predetermined second voltage. With such an arrangement, the second bias circuit may comprise a third transistor, the control terminal of which is connected to the control terminals of the first bias transistor and the second bias transistor such that they share a common control terminal. Also, a predetermined second bias current may be supplied to a path including the third transistor.

With such an arrangement, the second bias current flows through the third transistor, thereby generating stable second voltage.

The second bias circuit may further comprise a fourth transistor which is serially connected to the third transistor, and which is provided on the same path for the third transistor, and the control terminal of which is biased at the predetermined first voltage.

With such an arrangement, the electric potential at a node between the third transistor and the fourth transistor matches the electric potential between the first switching transistor and the first output transistor, and the electric potential at a node between the second switching transistor and the second output transistor. Such an arrangement properly generates the second voltage.

With 1:M (M represents a positive real number) as the size ratio of the first transistor to each of the first output transistor and the second output transistor, with 1:N (N represents a positive real number) as the size ratio of the third transistor to each of the first bias transistor and the second bias transistor, and with x:y as the current value ratio of the first bias current to the second bias current, the ratio xM/yN may be set to a value in a range between 2 and 10.

The fixed-voltage terminal may be a grounded terminal. Also, all of the transistors may be N-channel MOSFETs (Metal Oxide Semiconductor Field Effect Transistors).

Also, the transmission device may be integrally formed on a single semiconductor substrate. Examples of arrangements "integrally formed" include: an arrangement in which all the components of a circuit are formed on a semiconductor substrate; and an arrangement in which principal components of a circuit are integrally formed. With such an arrangement, a part of the resistors, capacitors, and so forth, for adjusting circuit constants, may be provided in the form of components external to the semiconductor substrate. With such an arrangement, the transmission device is integrally formed in the form of a single LSI. This reduces the circuit area, and uniformly maintains the properties of the circuit elements.

Another embodiment of the present invention provides a transmission/reception apparatus. The transmission/reception apparatus comprises: a transmission device according to any one of the above-described embodiments; differential signal lines connected to the first output terminal and the second output terminal of the transmission device; and a receiving device which converts currents flowing through the differential signal lines into voltages, and amplifies the voltages thus converted.

yet another embodiment of the present invention provides electronic equipment. The electronic equipment comprises the above-described transmission/reception apparatus. Furthermore, the differential signal lines are provided to a movable portion of the electronic equipment.

Yet another embodiment of the present invention provides a receiving device, which converts, into a voltage signal, differential signals that are input in the form of current signals via a first input terminal and a second input terminal. The receiving device comprises: a first input transistor, a first resistor, and a first receiving bias transistor, which are serially connected between the first input terminal and a fixed-voltage terminal to which a stable electric potential is applied; a second input transistor, a second resistor, and a second receiving bias transistor, which are serially connected between the second input terminal and the fixed-voltage terminal; and a differential amplifier which performs differential amplification of a first voltage at a node between the first input transistor and the first resistor and a second voltage at a node between the second input transistor and the second resistor. With the receiving device, a third voltage at a node between the first receiving bias transistor and the first resistor is applied to the control terminal of the second input transistor. Furthermore, a fourth voltage at a node between the second receiving bias transistor and the second resistor is applied to the control terminal of the first input transistor. Moreover, a bias voltage, which changes according to the electric potential at the fixed-voltage terminal, is applied to the control terminals of the first receiving bias transistor and the second receiving bias transistor.

With such an arrangement, the bias states of the first and second input transistors are controlled according to feedback signals, i.e., the currents that flow through the first and second input terminals. Such an arrangement suppresses fluctuations in the voltages at the first and second input terminals, thereby providing high-speed signal transmission. Furthermore, with such an arrangement, the voltages at the control terminals of the first and second receiving bias transistors are adjusted according to the voltage at the fixed-voltage terminal. Such an arrangement provides the first and second receiving bias transistors with stable bias states. This provides a stable voltage drop at each of the first and second receiving bias transistors, thereby providing high-speed signal transmission.

The receiving device may further comprise a receiving bias circuit which biases the bias voltage to the control terminals of the first receiving bias transistor and the second receiving bias transistor. Also, the receiving bias circuit may comprise: an impedance element, one terminal of which is connected to the fixed-voltage terminal, and which generates a voltage drop that corresponds to a current flow; and a current source which applies a predetermined current to the impedance element. With the receiving bias circuit, the voltage at the other terminal of the impedance element may be output as the aforementioned bias voltage.

With such an arrangement, each of the first and second receiving bias transistors is biased at a voltage drop generated by the impedance element. Such an arrangement provides a stable bias state even if the voltage at the fixed-voltage terminal fluctuates.

Also, the impedance element may include a MOSFET (Metal Oxide Semiconductor Field Effect Transistor), the gate and drain of which are connected to each other.

Also, the MOSFET may be of the same type as that of the first receiving bias transistor and the second receiving bias transistor. With such an arrangement, even if there is dispersion of the gate threshold voltage Vt or the on-resistance of the first receiving bias transistor or the second receiving bias transistor, the impedance element cancels such dispersion.

With such an embodiment, the receiving device may be integrally formed, using a CMOS manufacturing process, on a single semiconductor substrate. Examples of arrangements "integrally formed" include: an arrangement in which all the components of a circuit are formed on a semiconductor substrate; and an arrangement in which principal components of a circuit are integrally formed. With such an arrangement, a part of the resistors, capacitors, and so forth, for adjusting circuit constants, may be provided in the form of components external to the semiconductor substrate. With such an arrangement, the receiving device is integrally formed in the form of a single LSI. This reduces the circuit area, and uniformly maintains the properties of the circuit elements.

Yet another embodiment of the present embodiment provides a transmission/reception apparatus. The transmission/reception apparatus comprises: a receiving device according to any one of the above-described embodiments; differential signal lines connected to the first input terminal and the second input terminal of the receiving device; and a transmission device which outputs differential signals that are to be transmitted, in the form of current signals via the differential signal lines. Such an arrangement provides high-speed signal transmission.

Yet another embodiment of the present embodiment provides electronic equipment. The electronic equipment comprises the above-described transmission/reception apparatus. With such an arrangement, the differential signal lines are provided to a movable portion of the electronic equipment.

Such an arrangement enables a large amount of data to be transmitted even in a case that only a small number of signal lines can be provided to the movable portion.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
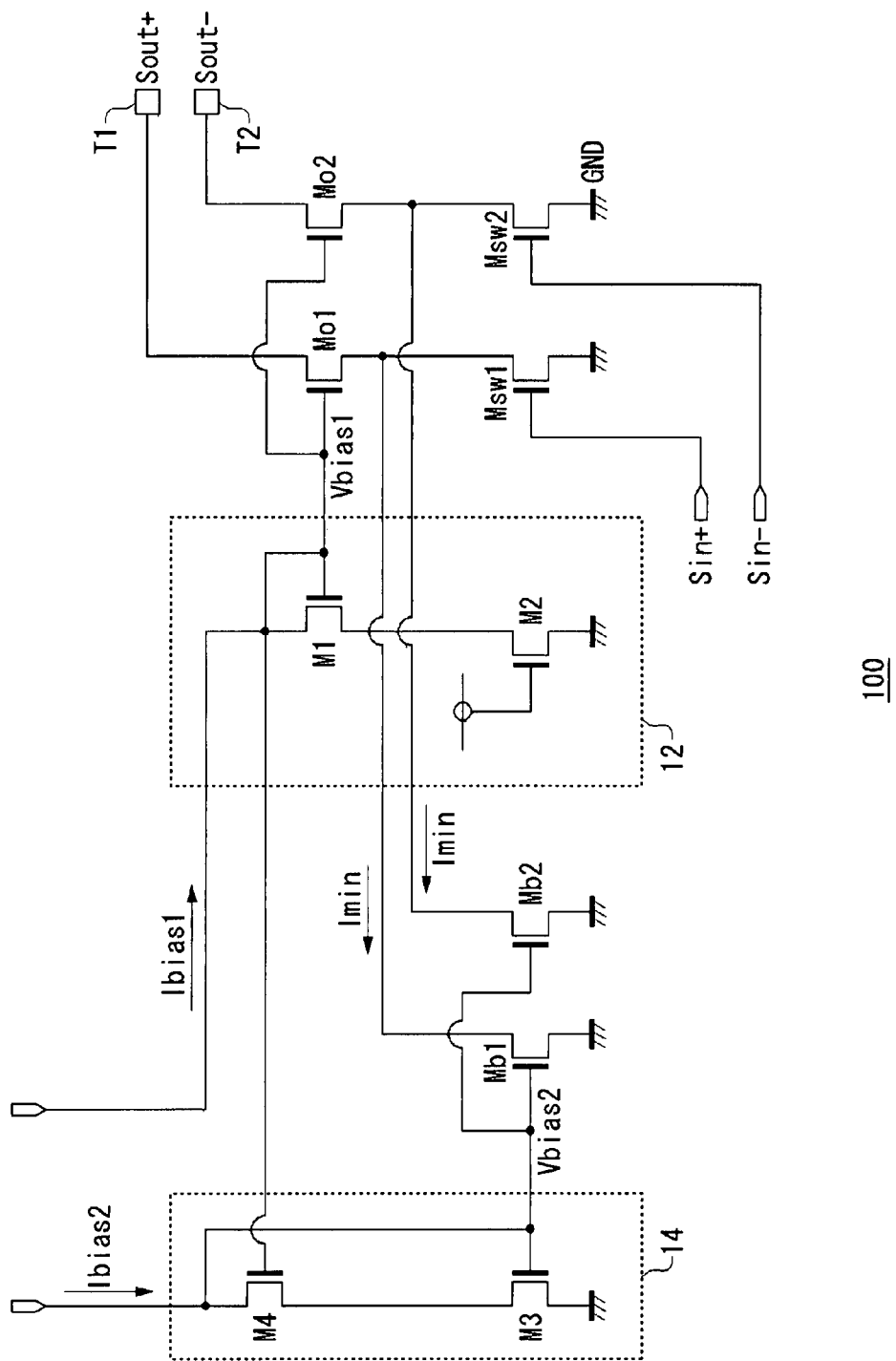
FIG. 1 is a circuit diagram which shows a configuration of a transmission device according to a first embodiment.

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A and the member B are connected to each other" includes a state in which the member A and the member B are physically and directly connected to each other. Also, the state represented by such a phrase include a state in which the member A and the member B are indirectly connected to each other via another member that does not affect the electric connection between the member A and the member B.

The present embodiment relates to a signal transmission technique for transmitting signals between multiple circuits included in a single electronic apparatus such as a cellular phone including a camera and a communication circuit. In particular, the present invention relates to a technique for transmitting differential signals. The present embodiment allows cellular phone manufacturers to design layouts having a reduced number of differential signal lines provided on a substrate which is a component of a cellular phone. In particular, there is a strong demand for reducing the number of wiring lines provided to particular portions of the aforementioned electronic apparatus. Examples of such particular portions, include a movable portion of an electronic apparatus such as a hinge portion of a foldable cellular phone.

With a transmission device according to the present embodiment, two switching transistors convert differential signals, which are to be transmitted, into differential current signals, and output the current signals thus converted to differential signal lines. A receiving device receives the differential signals thus transmitted via the differential signal lines. Then, the receiving device converts the current signals included in the differential signals into respective voltage signals in the form of differential signals. Furthermore, the receiving device further converts the voltage signals thus converted into a voltage signal with an absolute voltage such as the grounded voltage as the base, and outputs the voltage signal thus converted.

In order to provide high-speed differential signal transmission, there is a need to reduce the change in the voltage signals included in the differential signals. With the present embodiment, the transmission device applies a regular bias current to the differential signal lines in addition to the aforementioned differential signals. Thus, the operating range of each transistor included in the receiving device can be changed to a range in which there is a small change in the voltage. Furthermore, with the receiving device, a transistor is provided such that the source and the drain thereof are connected between the input terminal for the differential signal and a resistor circuit. With such an arrangement, such a transistor has a function of clamping the differential signal, thereby reducing the change in the voltage signal included in the differential signal. Detailed description will be made below regarding a configuration of a transmission device 100 and a transmission/reception apparatus 1000 according to the present embodiment.

FIRST EMBODIMENT

FIG. 1 is a circuit diagram which shows a configuration of a transmission device 100 according to a first embodiment. The transmission device 100 receives as input signals, in the form of voltage signals, the differential signals Sin+ and Sin−, which have been output from an unshown block and which are to be transmitted. The transmission device 100 converts the differential signals Sin+ and Sin− into differential signals Sout+ and Sout− in the form of current signals, and outputs the differential signals Sout+ and Sout− via the first and second output terminals T1 and T2.

The transmission device 100 includes a first output transistor Mo1, a second output transistor Mo2, a first switching transistor Msw1, a second switching transistor Msw2, a first bias transistor Mb1, a second bias transistor Mb2, a first bias circuit 12, and a second bias circuit 14.

Each of the first transistor Mo1 and the first switching transistor Msw1 is an N-channel MOSFET. The first transistor Mo1 and the first switching transistor Msw1 are serially connected to each other between the first output terminal and the grounded terminal GND which is a fixed voltage terminal at which a fixed electric potential is provided. That is to say, the source of the first switching transistor Msw1 is grounded. The drain of the first output transistor Mo1 is connected to the first output terminal T1. Furthermore, the drain of the first switching transistor Msw1 is connected to the source of the first output transistor Mo1.

Also, each of the second output transistor Mo2 and the second switching transistor Msw2 is an N-channel MOSFET. The second output transistor Mo2 and the second switching transistor Msw2 are serially connected to each other between the grounded terminal GND and the second output terminal T2.

The first bias transistor Mb1 is an N-channel MOSFET which is the same type as that of the first switching transistor Msw1. The first bias transistor Mb1 is provided in parallel with the first switching transistor Msw1. Specifically, the source of the first bias transistor Mb1 is grounded. The drain thereof is connected to the source of the first output transistor Mo1 and the drain of the first switching transistor Msw1.

The second bias transistor Mb2 is of the same type as that of the second switching transistor Msw2, i.e., an N-channel MOSFET. The second bias transistor Mb2 is provided in parallel with the second switching transistor Msw2.

The differential signal pair, i.e., the differential signals Sin+ and Sin−, are input to the control terminals, i.e., the gates of the first switching transistor Msw1 and the second switching transistor Msw2, respectively. Furthermore, with the transmission device 100 shown in FIG. 1, the control terminals, i.e., the gates of the first transistor M1 and the second transistor M2, are biased at a predetermined first voltage Vbias1.

The first bias circuit 12 is a circuit for biasing the gates of the first output transistor Mo1 and the second output transistor Mo2 at the first voltage Vbias1. The first bias circuit 12 includes the first transistor M1 and the second transistor M2. The first transistor M1 is an N-channel MOSFET transistor which is of the same type as that of the first output transistor Mo1 and the second output transistor Mo2. The gate of the first transistor Mo1 is connected to the gate of the first output transistor Mo1 and to the gate of the second output transistor Mo2 such that the three transistors share a common gate.

The second transistor M2 is an N-channel MOSFET transistor which is of the same type as that of the first switching transistor Msw1 and the second switching transistor Msw2. The second transistor M2 is provided on the same path as for the first transistor M1, with the drain of the second transistor M2 being grounded. The gate of the second transistor M2 is biased at a fixed voltage (e.g., power supply voltage). The gate of the first transistor M1 is also connected to the drain of the first transistor M1.

With the first bias circuit 12, a predetermined first bias current Ibias1 is supplied to a path including the first transistor M1 and the second transistor M2. The first transistor M1, the first output transistor Mo1, and the second output transistor Mo2 are connected to one another in the form of a current mirror circuit. Let us say that the size ratio thereof is 1:M. Here, M represents a positive real number. Upon applying the first bias current Ibias1 to the first transistor M1, a maximum of Ibias1×M flows through the first output transistor Mo1 and the second output transistor Mo2. The current represented by the Expression Ibias1×M will also be referred to as "maximum driving current Imax" hereafter.

The second bias circuit 14 is provided so as to bias the gates of the first bias transistor Mb1 and the second bias transistor Mb2 at a predetermined second voltage Vbias2. The second bias circuit 14 includes a third transistor M3 and a fourth transistor M4.

The third transistor M3 is an N-channel MOSFET which is of the same type as that of the first bias transistor Mb1 and the second bias transistor Mb2. The gate thereof is connected to the gates of the first bias transistor Mb1 and the second bias transistor Mb2 such that they share a common gate. Furthermore, the source thereof is grounded. A predetermined second bias current Ibias2 is supplied to the gate of the third transistor M3. The gate of the third transistor M3 is connected to a node which is positioned on a path for the second bias current Ibias2, and which is positioned on the drain side of the third transistor M3. The second bias circuit 14 sets the gate voltage of the third transistor M3 to a predetermined second voltage Vbias2, thereby supplying the second voltage Vbias2 to the first bias transistor Mb1 and the second bias transistor Mb2.

The third transistor M3, the first bias transistor Mb1, and the second bias transistor Mb2 are connected to one another in the form of a current mirror circuit. Let us say that the size ratio thereof is 1:N. Here, N represents a real number. Upon applying the second bias current Ibias2 to the third transistor M3, a current, which is represented by the Expression Ibias2×N, flows through the first bias transistor Mb1 and the second bias transistor Mb2. The current, which is represented by the Expression Ibias2×N, will also be referred to as "minimum current Imin" hereafter.

The fourth transistor M4 is an N-channel MOSFET which is of the same type as that of the first transistor M1. The fourth transistor M4 is serially connected to the third transistor M3 such that they share the same path. The gate of the fourth transistor M4 is biased at the first voltage Vbias. That is to say, the gate of the fourth transistor M4 is connected to the gates of the first transistor M1, the first output transistor Mo1, and the second output transistor Mo2 such that they share a common gate. The drain of the third transistor M3 is connected to the source of the fourth transistor M4. The gate of the third transistor M3 is connected to the drain of the fourth transistor M4. Also, an arrangement may be made without involving the fourth transistor M4. However, an arrangement including the fourth transistor M4 provides a function of setting the electric potential at the node between the third transistor M3 and the fourth transistor M4 to the electric potential at a node between the first switching transistor Msw1 and the first output transistor Mo1 and the electric potential at a node between the second switching transistor Msw2 and the second output transistor Mo2. Such an arrangement properly generates the second voltage Vbias2.

All the transistors employed in the transmission device 100 according to the present embodiment are N-channel MOSFETs. Such an arrangement employing only N-channel MOSFETs simplifies circuit design. Note that it is needless to say that a part of the transistors can be replaced by P-channel MOSFETs, which can be readily conceived by those skilled in this art.

Figure 2:
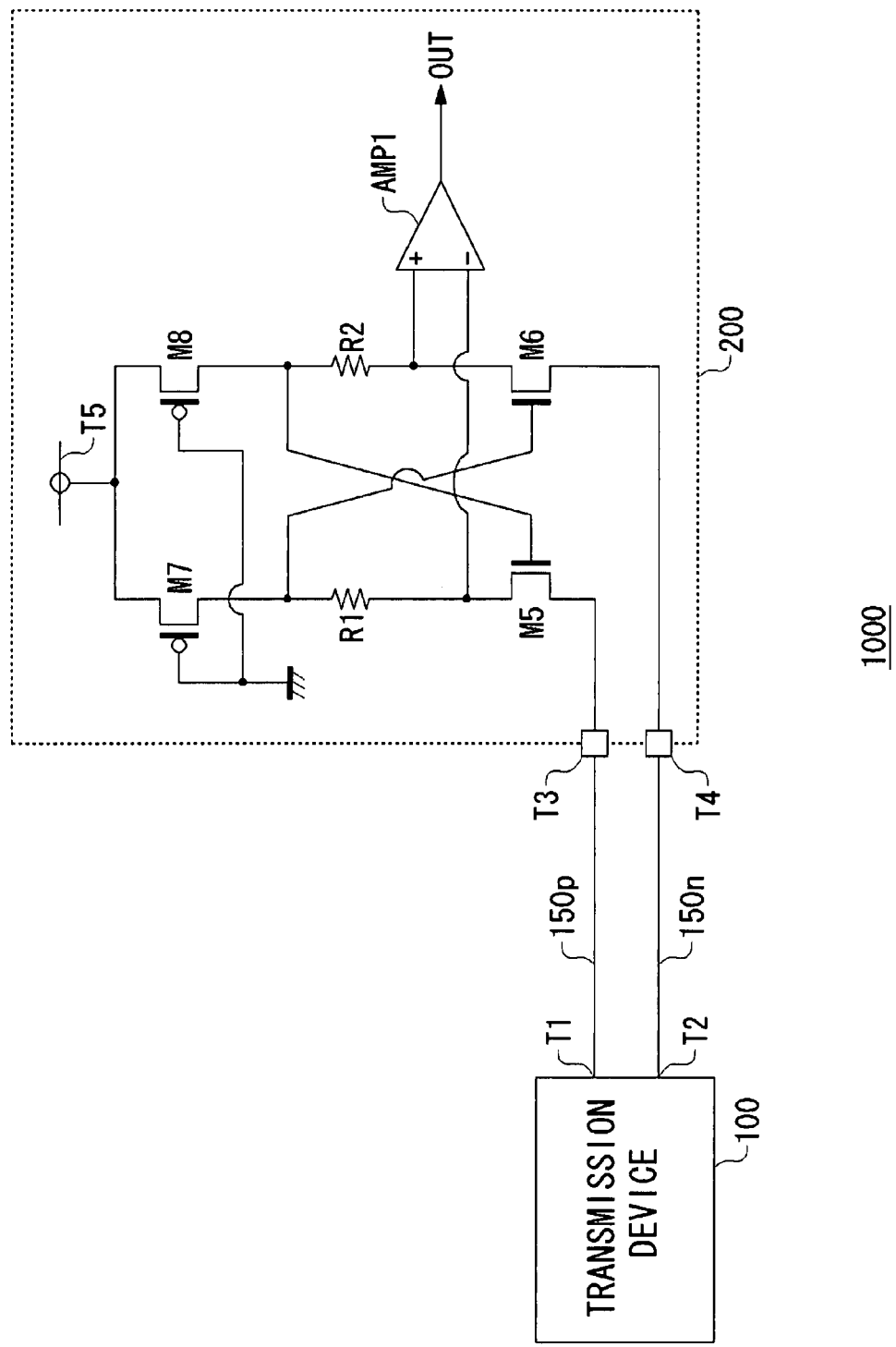
FIG. 2 is a circuit diagram which shows an overall configuration of a transmission/reception apparatus including the transmission device shown in FIG. 1 and a receiving device.

FIG. 2 is a circuit diagram which shows an overall configuration of the transmission/reception apparatus 1000 including the transmission device 100 shown in FIG. 1 and a receiving device 200. The transmission device 100 and the receiving device 200 are connected to each other via differential signal lines 150p and 150n. FIG. 2 shows a simplified configuration of the transmission device 100.

A first input terminal T3 and a second input terminal T4 of the receiving device 200 are connected to the first output terminal T1 and the second output terminal T2 of the transmission device 100 via the differential signal lines 150p and 150n. The receiving device 200 includes a first input transistor M5, a second input transistor M6, a first receiving bias transistor M7, a second receiving bias transistor M8, a first resistor R1, a second resistor R2, and a differential amplifier AMP1. Each of the first input transistor M5 and the second input transistor M6 is an N-channel MOSFET. The source of the first input transistor M5 is connected to the first input terminal T3. The source of the second input transistor M6 is connected to the second input terminal T4. The first receiving bias transistor M7, the first resistor R1, and the first input transistor M5 are serially connected on a path from the power supply terminal T5 to the first input terminal T3. The power supply voltage Vdd, which is a predetermined fixed voltage, is applied to the power supply terminal T5. The first receiving bias transistor M7 is a P-channel MOSFET. The grounded voltage, which is a fixed voltage, is applied to the gate of the first receiving bias transistor M7. Also, the voltage thus applied to the gate of the first receiving bias transistor M7 may be adjusted according to the power supply voltage.

The second receiving bias transistor M8, the second resistor R2, and the second input transistor M6 are components that correspond to the first receiving bias transistor M7, the first resistor R1, and the first input transistor M5, respectively. These components are serially connected between the power supply terminal T5 and the second input terminal T4.

The gate of the first input transistor M5 is biased at a voltage at a node between the second resistor R2 and the second receiving bias transistor M8. The gate of the second input transistor M6 is biased at a voltage at a node between the first resistor R1 and the first receiving bias transistor M7. As described above, the bias voltages are applied crosswise, thereby adjusting the bias states of the first input transistor M5 and the second input transistor M6 according to the currents flowing through the differential signal lines 150p and 150n. This suppresses fluctuations in the voltages at the first input terminal T3 and the second input terminal T4.

The differential amplifier AMP1 amplifies the difference in voltage between the voltage Vx1 at a node between the first resistor R1 and the first input transistor M5 and the voltage Vx2 at a node between the second resistor R2 and the second input transistor M6. Furthermore, the differential amplifier AMP1 converts the differential signals thus received into a single-ended signal OUT.

Note that the receiving device 200 shown in FIG. 2 has been described for exemplary purposes only, and this description is by no means intended to restrict the circuit configuration thereof. For example, an arrangement may be made having the simplest configuration including only the first resistor R1, the second resistor R2, and the differential amplifier AMP1.

Description will be made regarding the operation of the transmission device 100 and the overall operation of the transmission/reception apparatus 1000.

The current that flows through the first output transistor Mo1 is the sum of the minimum current Imin that flows through the first bias transistor Mb1 and the current that flows through the first switching transistor Msw1. In the same way, the current that flows through the second output transistor Mo2 is the sum of the minimum current Imin that flows through the second bias transistor Mb2 and the current that flows through the second switching transistor Msw2.

The first switching transistor Msw1 and the second switching transistor Msw2 are on/off controlled according to the differential signals Sin+ and Sin−, respectively. On the other hand, the first bias transistor Mb1 and the second bias transistor Mb2 are in the normally-ON state. With such an arrangement, the current Imin=Ibias2×N flows through each of the first bias transistor Mb1 and the second bias transistor Mb2, regardless of the state of the differential signals Sin+ and Sin−. Accordingly, in a case that the first switching transistor Msw1 is in the OFF state, the minimum current Imin=Ibias2×N flows through the first output transistor Mo1.

In a case that the first switching transistor Msw1 is in the ON state due to the differential signal Sin+ being in the high level state, the full current flows through the first output transistor Mo1. With such an arrangement, the first output transistor Mo1 is connected to the first transistor M1 in the form of a current mirror circuit. Accordingly, in this state, the maximum driving current Imax=Ibias1×M flows through the first output transistor Mo1.

In the same way, in a case that the second switching transistor Msw2 is in the OFF state, the current Imin=Ibias2×N flows through the second output transistor Mo2. On the other hand, in a case that the second switching transistor Msw2 is in the ON state, the current Imax=Ibias1×M flows through the second output transistor Mo2.

As an example, let us consider an arrangement in which Ibias1=Ibias2=100 µA, M=10, and N=2. With such an arrangement, the currents Imax and Imin, which flow through the first output transistor Mo1 and the second output transistor Mo2, are 1000 µA and 200 µA, respectively. These currents are output via the first output terminal T1 and the second output terminal T2 as the differential signals Sout+ and Sout−.

With the current ratio of the first bias current Ibias1 to the second bias current Ibias2 as x:y, the ratio xM/yN, i.e., the ratio of the maximum driving current Imax to the minimum current Imin, is preferably set to a range between 2 and 10. In the aforementioned arrangement, the ratio xM/yN is set to 5. Furthermore, the bias current Ibias2×N that normally flows through the first output transistor Mo1 and the second output transistor Mo2 is preferably set to an operating range in which each transistor in the same current path on the receiving device 200 side operates in the saturation region (active region or constant current range).

With regard to the receiving device 200, let us consider a case in which a current of 1000 µA flows through the differential signal line 150p, and a current of 200 µA flows through the differential signal line 150n. In this case, a large voltage occurs across the first resistor R1, and a small voltage drop occurs across the second resistor R2. Accordingly, the drain voltage of the first input transistor M5 is low. On the other hand, the drain voltage of the second input transistor M6 is high. As a result, the differential amplifier AMP1 outputs a low-level signal. Conversely, let us consider a case in which a current of 200 µA flows through the differential signal line 150p, and a current of 1000 µA flows through the differential signal line 150n. In this case, a small voltage drop occurs across the first resistor R1, and a large voltage drop occurs across the second resistor R2. Accordingly, the drain voltage of the first input transistor M5 is high. On the other hand, the drain voltage of the second input transistor M6 is low. As a result, the differential amplifier AMP1 outputs a high-level signal. As described above, the receiving device 200 converts into voltage signals the differential signals Sout+ and Sout−, which have been output from the transmission device 100 in the form of current signals, and performs differential amplification of the voltage signals thus converted, thereby outputting a voltage signal.

The transmission device 100 and the receiving device 200 according to the present embodiment provide the following advantages.

That is to say, with the transmission device 100 shown in FIG. 1, at least a minimum current Ibias2×N flows through each of the differential signal lines 150p and 150n, regardless of the state of the differential signals Sin+ and Sin−. This ensures that at least the minimum current Imin=Ibias2×N always flows through each of the first input transistor M5 and the second input transistor M6 on the receiving device 200 side. Thus, such an arrangement ensures that each of the first input transistor M5 and the second input transistor M6 operates in the saturation region (constant current range). In the saturation region, each transistor exhibits a small change in the drain-source voltage even if the current changes. Accordingly, there is a small change in the voltages at the first input terminal T3 and the second input terminal T4. This ensures that there is a small change in the voltages at the first output terminal T1 and the second output terminal T2.

In general, change in the voltage at a node or the voltage at a wiring line requires a finite period of time. With a narrower range of voltage to be changed, the period of time necessary for the change in the voltage is correspondingly smaller. With the transmission device 100 and the receiving device 200 according to the present embodiment, signal transmission is performed with a reduced voltage amplitude, thereby providing high-speed signal transmission.

Furthermore, with the transmission device 100 according to the present embodiment, the current which flows through the first switching transistor Msw1 and the current which flows through the first bias transistor Mb1 are output via the first output transistor Mo1. In the same way, the current which flows through the second switching transistor Msw2 and the current which flows through the second bias transistor Mb2 are output via the second output transistor Mo2. Accordingly, at least a minimum current Ibias2×N flows through each of the first output transistor Mo1 and the second output transistor Mo2. This ensures that each of the first output transistor Mo1 and the second output transistor Mo2 does not operate in a leak state. Such an arrangement enables the current to be changed in a range between 200 and 1000 μA in a short period of time, thereby providing high-speed signal transmission. In addition, there is a small change in the source voltage of each of the first output transistor Mo1 and the second output transistor Mo2 due to the change in the currents that flow through the first output transistor Mo1 and the second output transistor Mo2. This further improves high-speed signal transmission. Thus, the transmission device 100 shown in FIG. 1 provides high-speed signal transmission even if the receiving device 200 does not include any transistor on the current path.

SECOND EMBODIMENT

Figure 3:
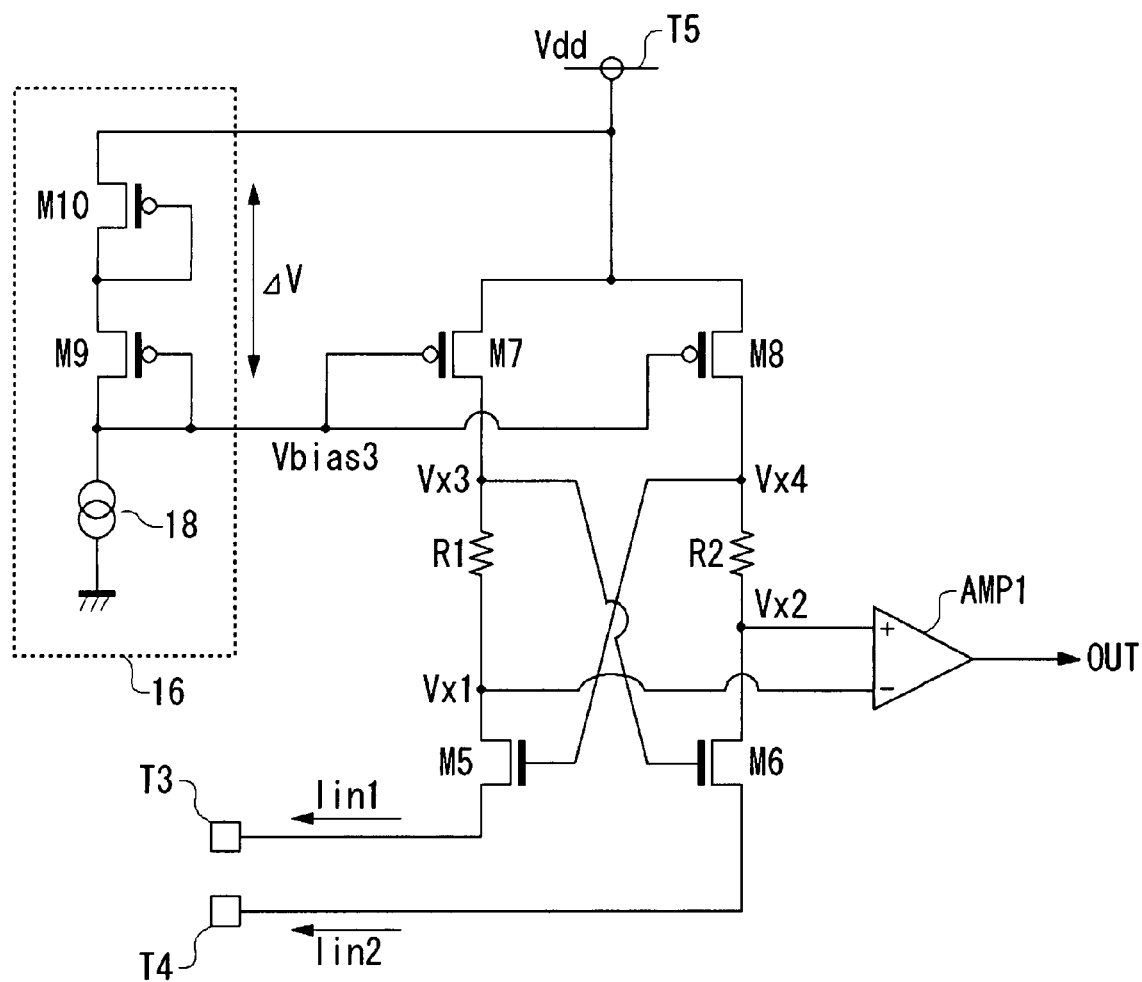
FIG. 3 is a circuit diagram which shows a configuration of a receiving device according to a second embodiment.

The second embodiment provides a receiving device 200a that provides higher-speed signal transmission than with the receiving device 200 shown in FIG. 2. FIG. 3 is a circuit diagram which shows the receiving device 200a according to the second embodiment.

The receiving device 200a converts the differential signals Iin1 and Iin2, which have been input via the first input terminal T3 and the second input terminal T4 in the form of current signals, into a voltage signal OUT. FIG. 3 shows an arrangement in which the currents Iin1 and Iin2 flow outward in the direction away from the receiving device 200a. However, the currents Iin1 and Iin2 serve as input data signals. Accordingly, the currents Iin1 and Iin2 will be referred to as "input differential signals" hereafter.

The receiving device 200a includes the first input transistor M5, the second input transistor M6, the first resistor R1, the second resistor R2, the first receiving bias transistor M7, the second receiving bias transistor M8, the differential amplifier AMP1, and a receiving bias circuit 16.

Each of the first input transistor M5 and the second input transistor M6 is an N-channel MOSFET. On the other hand, each of the first receiving bias transistor M7 and the second receiving bias transistor M8 is a P-channel MOSFET.

The first input transistor M5, the first resistor R1, and the first receiving bias transistor M7 are serially connected between the first input terminal T3 and the power supply terminal T5, to which is applied the power supply voltage Vdd, which provides a stable electric potential. In the same way, the second input transistor M6, the second resistor R2, and the second receiving bias transistor M8 are serially connected between the second input terminal T4 and the power supply terminal T5. The differential amplifier AMP1 performs differential amplification of the first voltage Vx1 at a node between the first input transistor M5 and the first resistor R1 and the second voltage Vx2 at a node between the second input transistor M6 and the second resistor R2.

Furthermore, the fourth voltage Vx4, which is a voltage at a node between the second receiving bias transistor M8 and the second resistor R2, is applied to the gate of the first input transistor M5. Moreover, the third voltage Vx3, which is a voltage at a node between the first receiving bias transistor M7 and the first resistor R1, is applied to the gate of the second input transistor M6. These circuit components are connected in the same form as those of the receiving device 200 shown in FIG. 2.

With regard to the receiving device 200 shown in FIG. 2, the gates of the first receiving bias transistor M7 and the second receiving bias transistor M8 are grounded. On the other hand, with regard to the receiving device 200a shown in FIG. 3, the bias voltage Vbias3, which is adjusted according to the power supply voltage Vdd, is applied to the gates of the first receiving bias transistor M7 and the second receiving bias transistor M8. The phrase "the bias voltage is adjusted according to the power supply voltage Vdd" as used here means that the bias voltage is adjusted such that the gate-source voltages of the first receiving bias transistor M7 and the second receiving bias transistor M8 are maintained at a constant voltage.

The receiving bias circuit 16 includes a ninth transistor M9, a tenth transistor M10, and a current source 18. Each of the ninth transistor M9 and the tenth transistor M10 is a P-channel MOSFET which is of the same type as that of the first receiving bias transistor M7 and the second receiving bias transistor M8. With regard to each of the ninth transistor M9 and the tenth transistor M10, the gate thereof is connected to the drain thereof. The ninth transistor M9 and the tenth transistor M10 are serially connected to each other. One terminal of the series circuit thus formed is connected to the power supply terminal T5. The current source 18 applies a constant current to the path formed of the ninth transistor M9 and the tenth transistor M10. The ninth transistor M9 and the tenth transistor M10 generate a voltage drop ΔV that corresponds to the constant current. Accordingly, the bias voltage Vbias3 output from the receiving bias circuit 16 is represented by the Expression Vdd−ΔV.

Description will be made regarding the operation of the receiving device 200a having the above-described configuration. The receiving device 200a provides the same basic operation as that of the receiving device 200 shown in FIG. 2. The first voltage Vx1 and the second voltage Vx2 change according to the change in the differential signals Iin1 and Iin2. The receiving device 200a performs differential amplification of the first voltage Vx1 and the second voltage Vx2. In this step, the gate voltages of the first input transistor M5 and the second input transistor M6 are adjusted according to the currents Iin1 and Iin2. Such an arrangement suppresses fluctuations in the voltages at the first input terminal T3 and the second input terminal T4, thereby providing high-speed signal transmission.

The further advantage in the receiving device 200a shown in FIG. 3 can be clearly understood by comparing it to the receiving device 200 shown in FIG. 2. In the circuits shown in FIG. 2 and FIG. 3, each of the first receiving bias transistor M7 and the second receiving bias transistor M8 is used as a resistance element. In the circuit shown in FIG. 2, the gates of the first receiving bias transistor M7 and the second receiving bias transistor M8 are grounded, i.e., are set to a fixed electric potential. Accordingly, such a circuit shown in FIG. 2 has a problem in which, in a case that the power supply voltage Vdd at the power supply terminal T5 fluctuates, the bias state of the first receiving bias transistor M7 and the second bias transistor M8 fluctuates, leading to fluctuations in the resistance values thereof.

On the other hand, with the receiving device 200a shown in FIG. 3, the gate voltages of the first receiving bias transistor M7 and the second receiving bias transistor M8 are adjusted according to the power supply voltage Vdd. Specifically, with the source voltage as Vdd, each of the gate voltages is represented by the Expression Vdd−ΔV. Accordingly, each of the gate-source voltages of the first receiving bias transistor M7 and the second receiving bias transistor M8 matches ΔV, which is a constant value regardless of the power supply voltage Vdd. Such an arrangement provides the stable bias state of the first receiving bias transistor M7 and the second receiving bias transistor M8. This improves the voltage setting precision for the third voltage Vx3 and the fourth voltage Vx4, thereby increasing the signal transmission speed.

Furthermore, in the circuit shown in FIG. 3, each of the ninth transistor M9 and the tenth transistor M10, which serve as impedance elements, is of the same type as that of the first receiving bias transistor M7 and the second receiving bias transistor M8. Now, let us consider a case in which the properties of the first receiving bias transistor M7 and the second receiving bias transistor M8 change due to irregularities in the manufacturing process, or due to a change in temperature. Even in such a case, with such an arrangement, the properties of the ninth transistor M9 and the tenth transistor M10 change in a similar manner. This suppresses fluctuations in the bias state of the first receiving bias transistor M7 and the second receiving bias transistor M8, thereby suppressing fluctuations in the resistance values of the first receiving bias transistor M7 and the second receiving bias transistor M8.

Furthermore, with such an arrangement, the bias states, i.e., the resistance values of the first receiving bias transistor M7 and the second receiving bias transistor M8, can be adjusted by adjusting the current value generated by the current source 18 of the receiving bias circuit 16. Thus, such an arrangement allows the voltages Vx3 and Vx4 to be adjusted.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

For example, description has been made regarding the receiving devices 200 shown in FIGS. 2 and 200a shown in FIG. 3 having a configuration in which the input differential signals Iin1 and Iin2 are provided in the form of currents flowing from the receiving device 200 or the receiving device 200a into the differential signal lines 150p and 150n (the signal currents flow in the direction having the receiving device 200 or the receiving device 200a as the source). Also, an arrangement may be made in which the input differential signals Iin1 and Iin2 are provided in the form of currents flowing into the receiving device 200 or the receiving device 200a from the differential signal lines 150p and 150n (the signal currents flow in the direction having the receiving device 200 or the receiving device 200a as the sink). With such an arrangement, a modification may be made in which the relation between the grounded voltage (terminal) and the power supply voltage (terminal) is inverted as compared to the aforementioned arrangement. With such a modification, each P-channel MOSFET is replaced by an N-channel MOSFET, and each N-channel MOSFET is replaced by a P-channel MOSFET. With such a modification, the power supply terminal T5 shown in FIG. 3 is replaced by the grounded voltage. Although, unlike the power supply voltage, there are no fluctuations in the grounded voltage, there can be dispersion of the gate threshold voltage Vt and the on-resistance of each of the first receiving bias transistor M7 and the second receiving bias transistor M8. Accordingly, it is a significant point of the present invention that such a modification has the advantage of canceling such dispersion.

Also, with regard to the receiving device 200a shown in FIG. 3, each of the ninth transistor M9 and the tenth transistor M10 included in the receiving bias circuit 16 may be replaced by another impedance element such as a diode, a resistor, or the like. With such an arrangement, the impedance element thus replaced generates an approximately constant voltage drop ΔV, thereby stabilizing the gate-source voltages of the first receiving bias transistor M7 and the second receiving bias transistor M8.

A combination of the receiving device 200a shown in FIG. 3 and the transmission device 100 shown in FIG. 1 provides high-speed data transmission. Also, the configuration of the transmission device 100 shown in FIG. 1 may be replaced by other configurations.

While the preferred embodiments of the present invention have been described using specific terms, such description is for illustrative purposes only, and it is to be understood that changes and variations may be made without departing from the spirit or scope of the appended claims.

What is claimed is:

1. A transmission device, which transmits differential signals that are to be transmitted, in the form of current signals via a first output terminal and a second output terminal, comprising:

a first switching transistor and a first output transistor which are serially connected between a fixed-voltage terminal that is set to a fixed voltage and said first output terminal;

a second switching transistor and a second output transistor which are serially connected between said fixed-voltage terminal and said second output terminal;

a first bias transistor and a second bias transistor which are provided in parallel with said first switching transistor and said second switching transistor, respectively, and each of which generates a predetermined bias current; and a second bias circuit which biases the control terminals of said first bias transistor and said second bias transistor at a predetermined second voltage, wherein a pair of the differential signals to be transmitted are input to the control terminals of said first switching transistor and said second switching transistor;

wherein the control terminals of said first output transistor and said second output transistor are biased at a predetermined first voltages;

wherein said second bias circuit comprises a third transistor, the control terminal of which is connected to the control terminals of said first bias transistor and said second bias transistor such that they share a common control terminal;

and wherein a predetermined second bias current is supplied to a path including said third transistor;

and wherein the control terminal of said third transistor is connected to a node on a path for the second bias current.

2. A transmission device according to claim 1, further comprising a first bias circuit which biases the control terminals of said first output transistor and said second output transistor at the predetermined first voltage, wherein said first bias circuit comprises:

a first transistor, the control terminal of which is connected to the control terminals of said first output transistor and said second output transistor such that they share a common control terminal; and a second transistor which is provided on a path for said first transistor, and one terminal of which is connected to said fixed-voltage terminal, and wherein a predetermined first bias current is supplied to a path including said first transistor and said second transistor.

3. A transmission device according to claim 1, wherein said second bias circuit further comprises a fourth transistor which is serially connected to said third transistor, and which is provided on the same path for said third transistor, and the control terminal of which is biased at the predetermined first voltage.

4. A transmission device according to claim 1, wherein said fixed-voltage terminal is a grounded terminal, and wherein all of the said transistors are N-channel MOSFETs.

5. A transmission device according to claim 1, which is integrally formed on a single semiconductor substrate.

6. A transmission/reception apparatus comprising:

a transmission device according to claim 1;

differential signal lines connected to said first output terminal and said second output terminal of said transmission device; and a receiving device which converts currents flowing through said differential signal lines into voltages, and amplifies the voltages thus converted.

7. A transmission device, which transmits differential signals that are to be transmitted, in the form of current signals via a first output terminal and a second output terminal, comprising: a first switching transistor and a first output transistor which are serially connected between a fixed-voltage terminal that is set to a fixed voltage and said first output terminal; a second switching transistor and a second output transistor which are serially connected between said fixed-voltage terminal and said second output terminal; a first bias transistor and a second bias transistor which are provided in parallel with said first switching transistor and said second switching transistor, respectively, and each of which generates a predetermined bias current; a first bias circuit which biases the control terminals of said first output transistor and said second output transistor at the predetermined first voltage; and a second bias circuit which biases the control terminals of said first bias transistor and said second bias transistor at a predetermined second voltage; wherein a pair of the differential signals to be transmitted are input to the control terminals of said first switching transistor and said second switching transistor; and wherein the control terminals of said first output transistor and said second output transistor are biased at a predetermined first voltage; and wherein said first bias circuit comprises: a first transistor, the control terminal of which is connected to the control terminals of said first output transistor and said second output transistor such that they share a common control terminal; and a second transistor which is provided on a path for said first transistor, and one terminal of which is connected to said fixed-voltage terminal; and wherein a predetermined first bias current is supplied to a path including said first transistor and said second transistor; and wherein said second bias circuit comprises a third transistor, the control terminal of which is connected to the control terminals of said first bias transistor and said second bias transistor such that they share a common control terminal; and wherein a predetermined second bias current is supplied to a path including said third transistor; and wherein the control terminal of said third transistor is connected to a node on a path for the second bias current; and wherein, with 1:M; where M represents a positive real number, as the size ratio of said first bias transistor to each of said first output transistor and said second output transistor, with 1:N; where N represents a positive real number, as the size ratio of said third transistor to each of said first bias transistor and said second bias transistor, and with x:y as the current value ratio of the first bias current to the second bias current, the ratio xM/yN is set to a value in a range between 2 and 10.

* * * * *